(12) United States Patent
Sakamoto

(10) Patent No.: US 11,330,158 B2
(45) Date of Patent: May 10, 2022

(54) IMAGING ELEMENT AND IMAGING DEVICE FOR IMAGE PLANE PHASE DIFFERENCE DETECTION

(71) Applicant: SONY SEMICONDUCTOR SOLUTIONS CORPORATION, Kanagawa (JP)

(72) Inventor: Toshiki Sakamoto, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/639,243

(22) PCT Filed: Jul. 25, 2018

(86) PCT No.: PCT/JP2018/027865
§ 371 (c)(1),
(2) Date: Feb. 14, 2020

(87) PCT Pub. No.: WO2019/039177
PCT Pub. Date: Feb. 28, 2019

(65) Prior Publication Data
US 2020/0213488 A1  Jul. 2, 2020

(30) Foreign Application Priority Data
Aug. 23, 2017 (JP) .............................. JP2017-159957

(51) Int. Cl.
*H04N 5/225* (2006.01)
*H04N 5/232* (2006.01)

(52) U.S. Cl.
CPC ......... *H04N 5/2254* (2013.01); *H04N 5/2253* (2013.01); *H04N 5/232122* (2018.08)

(58) Field of Classification Search
CPC ........... H04N 5/2254; H04N 5/232122; H04N 5/2253; H04N 5/36961; H04N 5/37457;
(Continued)

(56) References Cited

U.S. PATENT DOCUMENTS

2005/0139750 A1* 6/2005 Dobashi ............ H01L 27/14621
250/208.1
2010/0123811 A1* 5/2010 Abe ........................ H04N 5/335
348/294

(Continued)

FOREIGN PATENT DOCUMENTS

CN          1745478 A     3/2006
CN        101714567 A     5/2010
(Continued)

OTHER PUBLICATIONS

International Search Report and Written Opinion prepared by the Japanese Patent Office dated Oct. 3, 2019, for International Application No. PCT/JP2018/027865.

*Primary Examiner* — Gevell V Selby
(74) *Attorney, Agent, or Firm* — Sheridan Ross P.C.

(57) ABSTRACT

Pixel formation in an imaging element configured to detect image plane phase difference is simplified. The imaging element includes an on-chip lens, a plurality of photoelectric conversion portions, and a plurality of waveguides. The on-chip lens concentrates incident light on a pixel and is placed on each pixel so as to be shifted from a center of the pixel according to an incident angle of the incident light. The plurality of photoelectric conversion portions is arranged in the pixel and performs photoelectric conversion according to the incident light. The plurality of waveguides is arranged for the plurality of respective photoelectric conversion portion in the pixel. The plurality of waveguides guide the incident light concentrated so that the incident light enters each of the plurality of photoelectric conversion portion, and are formed into shapes dissimilar to each other based on the shift of the on-chip lens.

16 Claims, 11 Drawing Sheets

(58) Field of Classification Search
CPC .......... H01L 27/146; G02B 3/00; G02B 7/34; G03B 13/36
See application file for complete search history.

(56) References Cited

U.S. PATENT DOCUMENTS

| | | | |
|---|---|---|---|
| 2010/0225791 A1* | 9/2010 | Nakayama | H04N 5/335 348/273 |
| 2015/0229833 A1* | 8/2015 | Numata | H04N 5/36961 348/294 |
| 2016/0109707 A1 | 4/2016 | Schowengerdt | |
| 2016/0172390 A1 | 6/2016 | Numata | |
| 2016/0234446 A1* | 8/2016 | Numata | H04N 5/3559 |

FOREIGN PATENT DOCUMENTS

| | | |
|---|---|---|
| JP | 2005-259824 | 9/2005 |
| JP | 2015-032610 | 2/2015 |
| JP | 2015-152738 | 8/2015 |
| WO | WO-2008038016 A1 | 4/2008 |

* cited by examiner

F I G . 1
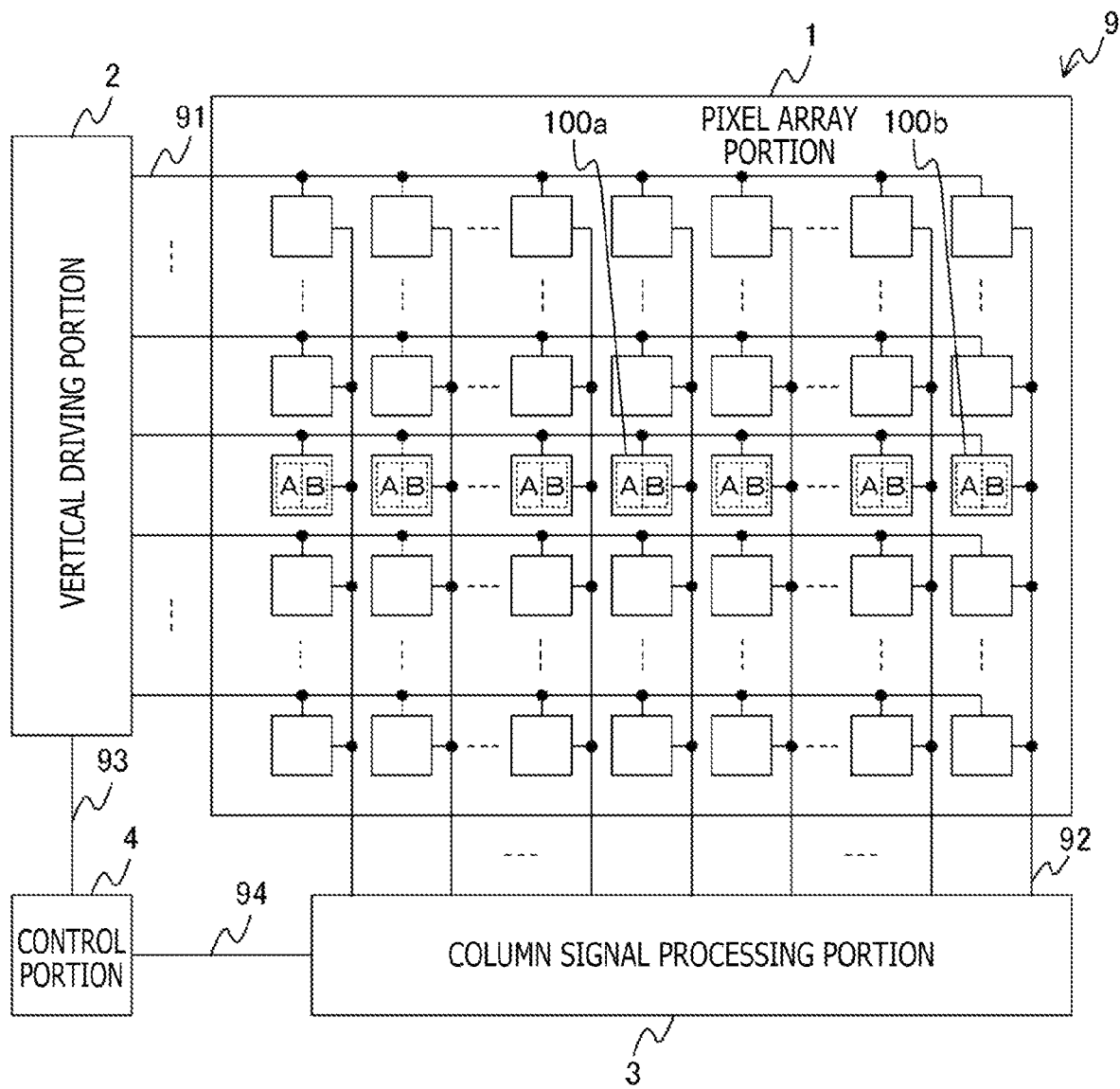

a b a b a b c d e a b a b a b c d

IMAGING ELEMENT AND IMAGING DEVICE FOR IMAGE PLANE PHASE DIFFERENCE DETECTION

CROSS REFERENCE TO RELATED APPLICATIONS

This application is a national stage application under 35 U.S.C. 371 and claims the benefit of PCT Application No. PCT/JP2018/027865 having an international filing date of 25 Jul. 2018, which designated the United States, which PCT application claimed the benefit of Japanese Patent Application No. 2017-159957 filed 23 Aug. 2017, the entire disclosures of each of which are incorporated herein by reference.

TECHNICAL FIELD

The present technology relates to an imaging element and an imaging device. Specifically, the present technology relates to an imagine element and an imaging device configured to detect image plane phase differences.

BACKGROUND ART

Hitherto, as imaging elements that are used in cameras configured to perform autofocus, an imaging element in which pixels each including two photoelectric conversion portions, which are separated from each other, are arranged two-dimensionally in a grid pattern, has been used. In such an imaging element, photoelectric conversion is performed in each photoelectric conversion portion of each pixel so that two image signals are generated. In a camera using this imaging element, a phase difference between images generated from these two image signals is detected and a focus position is thus detected. Next, the position of a photographing lens is adjusted on the basis of the detected focus position so that autofocus is performed. The method that detects phase differences for autofocus by pixels arranged in an imaging element as described above is referred to as "image plane phase difference autofocus." Note that, in imaging after autofocus, the image signals from the two photoelectric conversion portions of the pixel are combined to be output as an image signal. With this, an image corresponding to an object can be obtained.

Further, in an imaging element, light from an object substantially vertically enters pixels arranged in the center portion of the imaging element through a photographing lens. Meanwhile, the light from the object diagonally enters pixels arranged in the peripheral portion of the imaging element. Thus, the amount of light that reaches the photoelectric conversion portions is low, resulting in low pixel sensitivity. In order to prevent a reduction in sensitivity of the pixels arranged in the peripheral portion, pupil correction is performed. Here "pupil correction" is a correction method that places a microlens on each pixel (hereinafter referred to as "on-chip lens") in a manner that the on-chip lens is eccentric to the center of the pixel according to light that diagonally enters the peripheral portion. Further, "on-chip lens" is a lens that is placed on each pixel to concentrate light incident on the pixel on the photoelectric conversion portions. With the eccentric on-chip lens placed on the optical axis of incident light that passes through the center between the photoelectric conversion portions, the amount of light incident on the photoelectric conversion portions can be increased, and a reduction in sensitivity can thus be prevented.

Also in the imaging element configured to detect the image plane phase differences described above, a reduction in sensitivity of the pixels arranged in the peripheral portion of the imaging element can be prevented through application of pupil correction. For example, as a surface imaging element in which a wiring layer configured to transmit image signals is formed between a semiconductor substrate in which photoelectric conversion portions are formed and on-chip lenses, an imaging element in which, in a wiring layer, waveguides are formed for every two photoelectric conversion portions (for example, see PTL 1), is used. Here, "waveguide" includes a core configured to transmit light and cladding surrounding the core, and guides incident light through an on-chip lens to a photoelectric conversion portion.

In this imaging element, two waveguides, namely, a first waveguide and a second waveguide, are arranged adjacent to each other. The first waveguide has an opening portion in a direction different from the eccentric direction of an on-chip lens with respect to the central axis of a pixel, while the second waveguide has an opening portion in the same direction as the eccentric direction of the on-chip lens. With the on-chip lens placed at a position that allows light that passes through the center of the on-chip lens to be radiated on the boundary portion between the first and second waveguides, phase differences can be detected at pixels arranged in the peripheral portion.

However, since light that has penetrated the on-chip lens enters the first and second waveguides at different incident angles, the coupling efficiency of light is different between the first and second waveguides. The reason of this is as follows: the first waveguide has the opening portion in the direction different from the eccentric direction of the on-chip lens and light thus enters the opening portion of the first waveguide at a larger incident angle than that in the second waveguide having the opening portion in the same direction as the eccentric direction of the on-chip lens, and with a large incident angle, light is coupled to a high-order light-guiding mode of a waveguide, resulting in small coupling coefficient in a waveguide having a finite degree. Thus, the sensitivity of a photoelectric conversion portion configured to receive incident light transmitted through the first waveguide is lower than the sensitivity of a photoelectric conversion portion configured to receive incident light transmitted through the second waveguide.

In order to prevent this reduction in sensitivity, in the related art described above, the first waveguide has a larger refractive index difference between the core and the cladding than the second waveguide. Alternatively, the first waveguide has a larger core cross-sectional area than the second waveguide. With at least one of the measures applied, the reduction in waveguide coupling efficiency is prevented so that the photoelectric conversion portions configured to receive incident light transmitted through the first and second waveguides have substantially the same sensitivity, with the result that a reduction in detection accuracy of phase differences is prevented.

CITATION LIST

Patent Literature

[PTL 1]
Japanese Patent Laid-open No. 2015-152738

SUMMARY

Technical Problem

In the related art described above, the first and second waveguides have different refractive index differences or different core cross-sectional areas according to the incident angles of light. However, in order to achieve a refractive index difference different between the first and second waveguides, the claddings or the cores of these waveguides are required to be made of different materials. Further, in order to achieve a cross-sectional area different between the first and second waveguides, while light that passes through the center of the on-chip lens is required to be radiated on the boundary between the first and second waveguides, the cross-sectional areas of the first and second waveguides are required to be different from each other according to incident angles. In either case, the waveguides are difficult to form, which is a problem.

The present technology has been made in view of the problem described above, and it is an object of the present technology to simplify the configuration of pixels in an imaging element configured to detect an image plane phase difference.

Solution to Problem

The present technology has been made to solve the problem described above, and according to a first aspect of the present technology, there is provided an imaging element including: an on-chip lens that is configured to concentrate incident light on a pixel and placed on each of pixels so as to be shifted from a center of the pixel according to an incident angle of the incident light; a plurality of photoelectric conversion portions arranged in the pixel and configured to perform photoelectric conversion according to the incident light; and a plurality of waveguides arranged for the plurality of respective photoelectric conversion portions in the pixel, the plurality of waveguides each being configured to guide the concentrated incident light so that the incident light enters each of the plurality of photoelectric conversion portions, and being formed into shapes dissimilar to each other on the basis of the shift of the on-chip lens. This provides an action that light incident through the on-chip lens placed by being shifted from the center of the pixel is guided to the plurality of respective photoelectric conversion portions by the plurality of waveguides formed into shapes dissimilar to each other. Light-guiding losses are assumed to be adjusted by the waveguides formed into the dissimilar shapes, and the sensitivity of each of the plurality of photoelectric conversion portions in the case where the on-chip lens is shifted is assumed to be corrected.

Further, in the first aspect, the plurality of waveguides may each include a core serving as an optical path and cladding accommodating the core, and may be different from each other in inner surface inclination of the cladding from an entrance to an exit of the incident light in each of the waveguides and thus have dissimilar shapes. This provides an action that incident light is guided by the waveguides including the cladding having the inner surface inclinations different from each other. Losses in light-guiding are assumed to be adjusted by the cladding having the inner surface inclinations different from each other.

Further, in the first aspect, the plurality of waveguides may be different from each other in inner surface inclination of the cladding according to the shift of the on-chip lens. This provides an action that incident light is guided by the waveguides including the cladding having the inclinations different from each other according to the shift of the on-chip lens. Losses in light-guiding according to the shift of the on-chip lens are assumed to be adjusted.

Further, in the first aspect, the plurality of waveguides may each include the cladding having a plurality of inner surfaces formed of different inclinations. This provides an action that incident light is guided by the waveguide including the cladding having the different inclinations. Losses in light-guiding are assumed to be adjusted by the cladding having the different inclinations.

Further, in the first aspect, the imaging element may further include: a pixel circuit that is placed in the pixel and configured to generate an image signal based on photoelectric conversion in the plurality of photoelectric conversion portions; and a wiring layer that is placed on a surface different from a surface for receiving the concentrated incident light, of surfaces of a semiconductor substrate in which the photoelectric conversion portions are formed, the wiring layer being configured to transmit the image signal. This provides an action that the waveguides are formed on a surface different from the surface of the semiconductor substrate on which the wiring layer is formed. Wiring layer interference-free waveguide formation is assumed.

Further, in the first aspect, the pixel may include two photoelectric conversion portions and two waveguides. This provides an action that the two waveguides configured to guide incident light to the respective two photoelectric conversion portions are arranged.

Further, in the first aspect, the pixels may be arranged two-dimensionally in a grid pattern, and the on-chip lens may be placed by being shifted from the center of the pixel according to the incident angle of the incident light on each of the pixels arranged. This provides an action that the on-chip lens is placed by being shifted with respect to the pixel according to the incident angle of incident light, and the plurality of pixels on each of which light is concentrated by the on-chip lens are arranged two-dimensionally in a grid pattern.

Further, in the first aspect, the imaging element may further include: a plurality of the on-chip lenses each of which is placed by being shifted from the center of the pixel according to the incident angle with respect to each lens configured to make light from an object enter an imaging element corresponding to the lens; and a plurality of the pixels each of which includes the plurality of waveguides that are formed into shapes dissimilar to each other on the basis of the shift of each of the plurality of on-chip lenses. This provides an action that the plurality of pixels each including the plurality of waveguides that are formed into the shapes dissimilar to each other according to the incident angle with respect to each lens are arranged. Losses in light-guiding in each pixel according to the plurality of lenses having different incident angles are assumed to be adjusted.

Further, according to a second aspect of the present technology, there is provided an imaging device including: an on-chip lens that is configured to concentrate incident light on a pixel and placed on each of pixels so as to be shifted from a center of the pixel according to an incident angle of the incident light; a plurality of photoelectric conversion portions arranged in the pixel and configured to perform photoelectric conversion according to the incident light; a plurality of waveguides arranged for the plurality of respective photoelectric conversion portions in the pixel, the plurality of waveguides each being configured to guide the concentrated incident light so that the incident light enters each of the plurality of photoelectric conversion portions, and being formed into shapes dissimilar to each other on the basis of the shift of the on-chip lens; a pixel circuit that is placed in the pixel and configured to generate an image signal based on photoelectric conversion in the plurality of photoelectric conversion portions; and a processing circuit configured to detect a phase difference on the basis of a plurality of image signals based on photoelectric conversion by the plurality of photoelectric conversion portions. This provides an action that light incident through the on-chip lens placed by being shifted from the center of the pixel is guided to the plurality of respective photoelectric conversion portions by the plurality of waveguides formed into the shapes dissimilar to each other. Light-guiding losses are assumed to be adjusted by the waveguides formed into the dissimilar shapes, and the sensitivity of each of the plurality of photoelectric conversion portions in the case where the on-chip lens is shifted is assumed to be corrected. Moreover, phase difference detection from image signals generated by the plurality of photoelectric conversion portions having corrected sensitivity is further assumed.

Advantageous Effect of Invention

According to the present technology, there is provided an excellent effect that, in the imaging element configured to detect image plane phase differences, the waveguides, which guide incident light to the plurality of respective photoelectric conversion portions, are formed into shapes dissimilar to each other so that the phase difference pixels on each of which the on-chip lens is placed by being shifted are formed in a simplified manner.

BRIEF DESCRIPTION OF DRAWINGS

FIG. 1 is a diagram illustrating a configuration example of an imaging element according to a first embodiment of the present technology.

DESCRIPTION OF EMBODIMENTS

Figure 2:
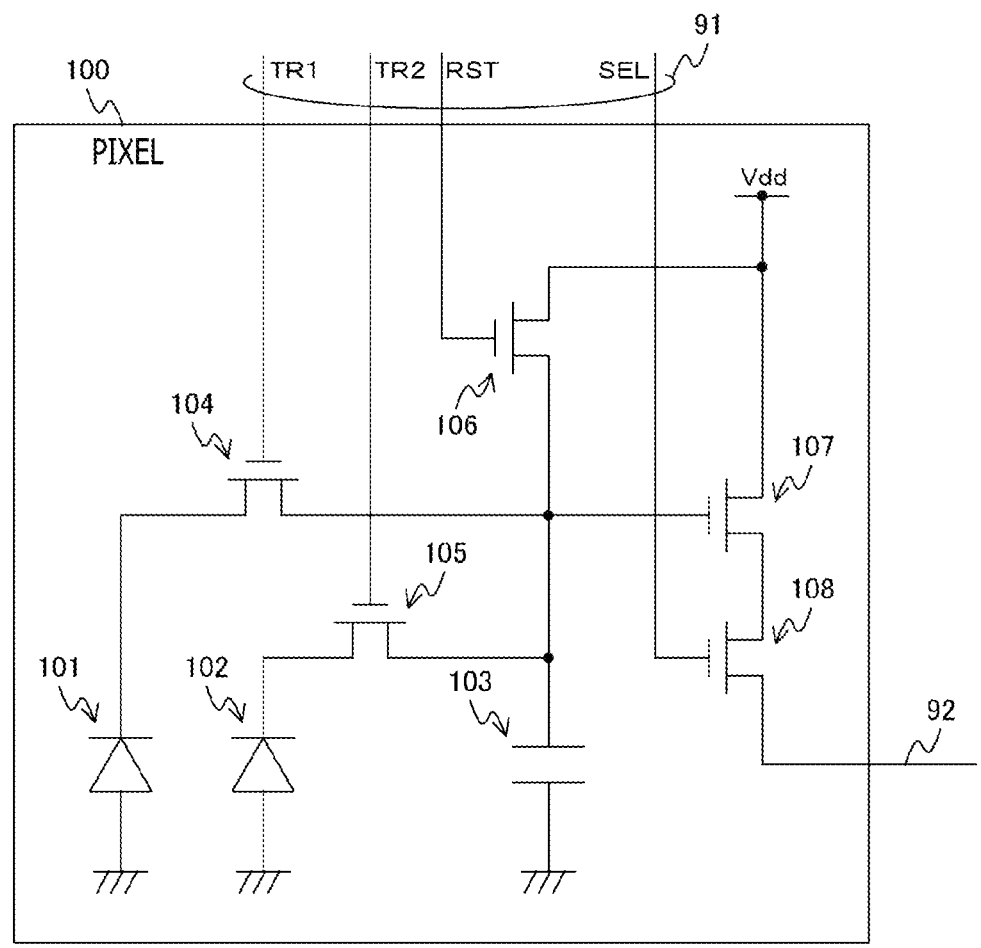
FIG. 2 is a diagram illustrating a configuration example of a pixel according to the first embodiment of the present technology.

Next, modes for carrying out the present technology (hereinafter referred to as "embodiment") will be described with reference to the drawings. In the following drawings, the same or similar parts are denoted by the same or similar reference signs. However, the drawings are schematic, and the dimensional ratios and the like of the respective parts do not necessarily match the actual ones. Further, it goes without saying that the drawings include portions having different dimensional relationships or ratios. Further, the embodiments will be described in the following order.
1. First Embodiment
2. Second Embodiment
3. Third Embodiment
4. Modified Examples
5. Application Example for Camera 1. First Embodiment

[Configuration of Imaging Element]

FIG. 1 is a diagram illustrating a configuration example of an imaging element according to a first embodiment of the present technology. An imaging element 9 in FIG. 1 includes a pixel array portion 1, a vertical driving portion 2, a column signal processing portion 3, and a control portion 4.

The pixel array portion 1 includes pixels 100 arranged two-dimensionally in a grid pattern. Here, the pixel 100 generates image signals corresponding to radiated light. As described later, the pixel 100 includes photoelectric conversion portions configured to generate charges corresponding to the radiated light. In addition, the pixel 100 also includes a pixel circuit. This pixel circuit generates image signals based on charges generated by the photoelectric conversion portions. Image signal generation is controlled by control signals generated by the vertical driving portion 2 described later. In the pixel array portion 1, signal lines 91 and 92 are arranged in an X-Y matrix. The signal line 91 is a signal line configured to transmit the control signals for the pixel circuits in the pixels 100. The signal line 91 is placed in each row of the pixel array portion 1 and connected to the pixels 100 arranged in the corresponding row, in common. The signal line 92 is a signal line configured to transmit the image signals generated by the pixel circuits of the pixels 100. The signal line 92 is placed in each column of the pixel array portion 1 and connected to the pixels 100 arranged in the corresponding column, in common. The photoelectric conversion portions and the pixel circuits are formed in a semiconductor substrate.

In FIG. 1, a pixel 100a represents the pixel 100 placed in the center portion of the pixel array portion 1, and a pixel 100b represents the pixel 100 placed in the peripheral portion of the pixel array portion 1. The pixels 100a and 100b are arranged in a row positioned around the center portion of the pixel array portion 1 and each include two photoelectric conversion portions. The dashed line rectangles illustrated in the pixels 100a and 100b in FIG. 1 represent the photoelectric conversion portions. Such pixels each including the two photoelectric conversion portions are used as phase difference pixels.

Here, "phase difference pixel" is a pixel configured to detect, as a phase difference, a shift between images formed by light that has passed through different regions of a photographing lens configured to concentrate light from an object to the pixel array portion 1 of the imaging element 9, and is a pixel used for autofocus. A plurality of such phase difference pixels is arranged in the row in which the pixels 100a and 100b are arranged, and the two photoelectric conversion portions are arranged side by side in the direction of the row in which the phase difference pixels are arranged is extended. This can be understood as follows: a phase difference pixel includes two pixels formed of photoelectric conversion portions separated from each other in the same direction as a direction in which phase difference pixels are arranged. Of the pixels separated from each other, the left pixel and the right pixel are referred to as "pixel A" and "pixel B," respectively. Light that has passed through the right portion of the photographing lens enters the pixel A, and light that has passed through the left portion the photographing lens enters the pixel B. Through detection of a phase difference between an image based on image signals generated by a plurality of the pixels A and an image based on image signals generated by a plurality of the pixels B in the row in which the pixels 100a and 100b are arranged, the focus position of the photographing lens with respect to an object can be detected. Through adjustment of the position of the photographing lens based on the detected focus position, autofocus can be performed.

In this way, light enters the imaging element 9 from an object through the photographing lens, and the light vertically enters the pixel 100a placed in the center portion of the pixel array portion 1. Meanwhile, the light diagonally enters the pixel 100b placed in the peripheral portion of the pixel array portion Specifically, in FIG. 1, the light diagonally enters the pixel 100b, which is placed at the right end of the pixel array portion 1, from an upper left position in the vertical direction of the pixel array portion 1. Accordingly, in order to correct this, the pupil correction described above is performed. The details of the configurations of the pixels 100a and 100b are described later.

The vertical driving portion 2 generates the control signals for the pixel circuits of the pixels 100. The vertical driving portion 2 transmits generated control signals to the pixels 100 through the signal line 91 in FIG. 1. The column signal processing portion 3 processes the image signals generated by the pixels 100. The column signal processing portion 3 processes image signals transmitted from the pixels 100 through the signal line 92 in FIG. 1. The processing in the column signal processing portion 3 corresponds to, for example, analog-to-digital conversion of converting analog image signals generated in the pixels 100 into digital image signals. The control portion 4 controls the entire imaging element 9. The control portion 4 generates and outputs control signals for controlling the vertical driving portion 2 and the column signal processing portion 3, to thereby control the imaging element 9. The control signals generated by the control portion 4 are transmitted to the vertical driving portion 2 through a signal line 93, and are transmitted to the column signal processing portion 3 through a signal line 94.

[Configuration of Pixel]

FIG. 2 is a diagram illustrating a configuration example of the pixel according to the first embodiment of the present technology. FIG. 2 is a circuit diagram illustrating the configuration of the pixel 100. The pixel 100 in FIG. 2 includes photoelectric conversion portions 101 and 102, a charge holding portion 103, and MOS transistors 104 to 108. Further, the signal line 91 in FIG. 2 includes a signal line TR1, a signal line TR2, a signal line RST, and a signal line SEL. Further, the pixel 100 is supplied with power supply through a power line Vdd. Note that, in the pixel 100 in FIG. 2, a circuit including the charge holding portion 103 and the MOS transistors 104 to 108 corresponds to the pixel circuit described above.

The photoelectric conversion portion 101 has an anode grounded and a cathode connected to the source of the MOS transistor 104. The photoelectric conversion portion 102 has an anode grounded and a cathode connected to the source of the MOS transistor 105. The MOS transistor 104 has a gate connected to the signal line TR1, and the MOS transistor 105 has a gate connected to the signal line TR2. The MOS transistor 104 has a drain connected to the drain of the MOS transistor 105, the source of the MOS transistor 106, the gate of the MOS transistor 107, and one end of the charge holding portion 103. The other end of the charge holding portion 103 is grounded. The MOS transistor 106 has a gate connected to the signal line RST, and a drain connected to the power line Vdd. The MOS transistor 107 has a drain connected to the power line Vdd, and a source connected to the drain of the MOS transistor 108. The MOS transistor 108 has a gate connected to the signal line SEL, and a source connected to the signal line 92.

The photoelectric conversion portions 101 and 102 perform photoelectric conversion according to light incident on the pixel 100. As the photoelectric conversion portions 101 and 102, photodiodes can be used. Charges generated through photoelectric conversion are held by the respective photoelectric conversion portions 101 and 102. Note that, the photoelectric conversion portion 101 can correspond to the photoelectric conversion portion of the pixel A described above, and the photoelectric conversion portion 102 can correspond to the photoelectric conversion portion of the pixel B described above.

The MOS transistors 104 and 105 are MOS transistors configured to transfer, to the charge holding portion 103, charges generated through photoelectric conversion by the photoelectric conversion portions 101 and 102 to be held. The MOS transistor 104 transfers charges of the photoelectric conversion portion 101, and the MOS transistor 105 transfers charges of the photoelectric conversion portion 102. The MOS transistor 104 is controlled by control signals that are transmitted through the signal line TR1, and the MOS transistor 105 is controlled by control signals that are transmitted through the signal line TR2.

The charge holding portion 103 holds charges generated by the photoelectric conversion portions 101 and 102 and transferred by the MOS transistors 104 and 105. As the charge holding portion 103, a floating diffusion region formed in the diffusion layer of a semiconductor substrate can be used.

The MOS transistor 106 is a MOS transistor for resetting the charge holding portion 103. The MOS transistor 106 is controlled by control signals that are transmitted through the signal line RST. The MOS transistor 106 electrically connects the charge holding portion 103 and the power line Vdd to each other, to thereby drain charges transferred to the charge holding portion 103 into the power line Vdd. With this, the charge holding portion 103 is reset. After the charge holding portion 103 has been reset, the MOS transistors 104 and 105 transfer charges.

The MOS transistor 107 is a MOS transistor configured to generate image signals based on the charges transferred to the charge holding portion 103. The MOS transistor 107 has a gate connected to the not-grounded terminal of the charge holding portion 103, and the source to which voltage according to the charges transferred to the charge holding portion 103 to be held is output. The MOS transistor 108 is a MOS transistor configured to output the image signals generated by the MOS transistor 107 to outside the pixel 100. The MOS transistor 108 is controlled by control signals that are transmitted through the signal line SEL. The MOS transistor 108 electrically connects the source of the MOS transistor 107 and the signal line 92 to each other, to thereby output image signals.

When autofocus is performed in the imaging element 9, generation of image signals based on photoelectric conversion by the photoelectric conversion portion 101 and generation of image signals based on photoelectric conversion by the photoelectric conversion portion 102 are performed alternately. Specifically, reset is performed after a predetermined exposure period has elapsed, and the charges generated and held by the photoelectric conversion portion 101 are transferred to the charge holding portion 103 by the MOS transistor 104. After that, an image signal is generated by the MOS transistor 107 and output from the pixel 100 through the MOS transistor 108 as an image signal of the pixel A. In a similar manner, charges generated by the photoelectric conversion portion 102 are transferred by the MOS transistor 105. An image signal is thereby generated and output from the pixel 100 as an image signal of the pixel B. Generation and output of the image signals are alternately performed, and autofocus is executed on the basis of the output image signals (the image signals of the pixel A and the pixel B).

Note that, when normal imaging is performed, an image signal that is a combination of the image signals based on the photoelectric conversion by the respective photoelectric conversion portions 101 and 102 is generated.

[Cross-Sectional Configuration of Pixel]

Figure 3:
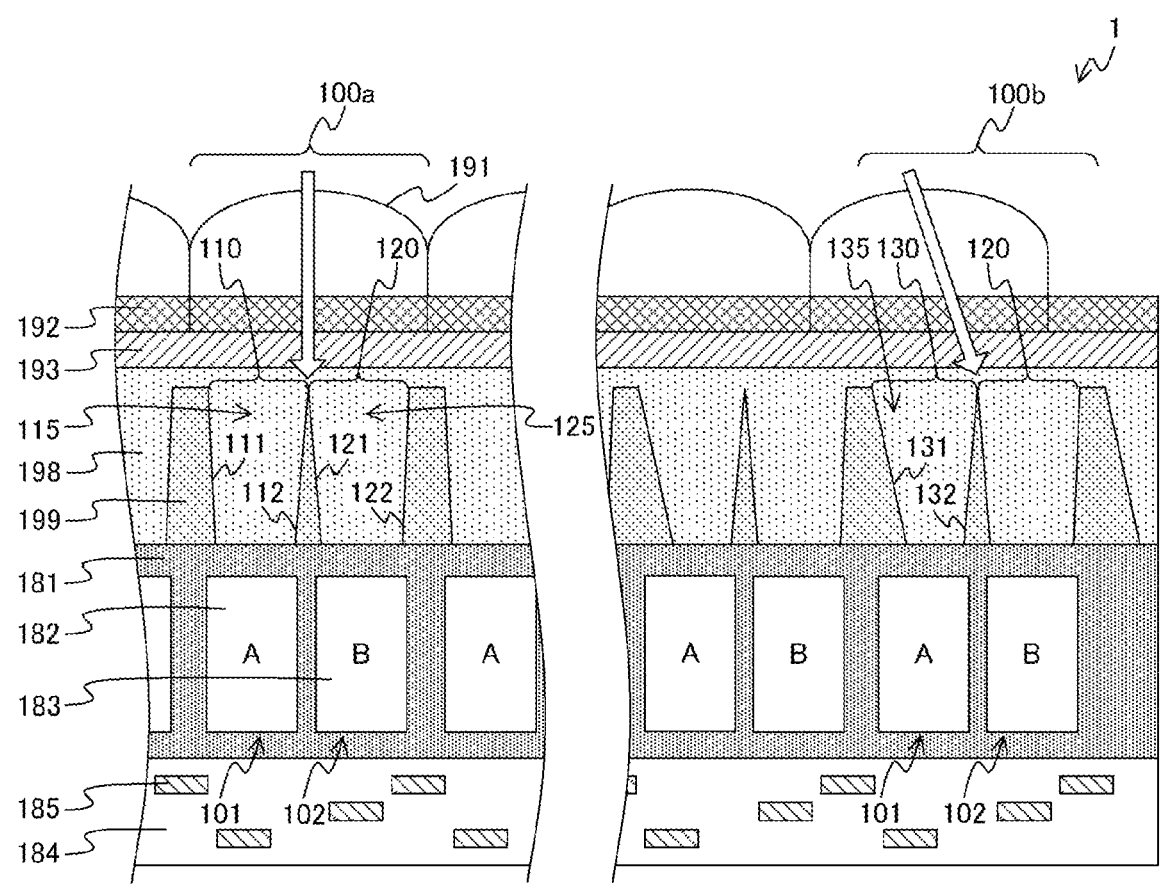
FIG. 3 is a view illustrating configuration examples of pixels according to the first embodiment of the present technology.

FIG. 3 is a view illustrating configuration examples of the pixels according to the first embodiment of the present technology. FIG. 3 is a schematic sectional view illustrating the configurations of the pixels 100, and is a view illustrating the configurations of the pixels 100a and 100b, which are described with reference to FIG. 1.

The pixel 100a includes an on-chip lens 191, a color filter 192, a planarization film 193, waveguides 110 and 120, a semiconductor substrate 181, a wiring layer 185, and an insulating layer 184. Further, the pixel 1004 includes a waveguide 130 instead of the waveguide 110. The pixel 100a placed in the center portion of the pixel array portion 1 and the pixel 100b placed in the peripheral portion thereof can have the same configuration except for waveguide shapes and the positions of the on-chip lens 191 with respect to the pixel 100. The pixel array portion 1 includes the pixels 100a and 100b.

The semiconductor substrate 181 is a semiconductor substrate in which the semiconductor portions of the pixels 100, such as the photoelectric conversion portions and the pixel circuits described with reference to FIG. 2, are formed. In FIG. 3, of those, the photoelectric conversion portions 101 and 102 are illustrated. For convenience, it is assumed that the semiconductor substrate 131 in FIG. 3 is formed as a P-type well region. The photoelectric conversion portion 101 has an N-type semiconductor region 182 and a P-type well region surrounding the N-type semiconductor region 182. At a PN junction formed on the interface between the N-type semiconductor region 182 and the P-type well region, photoelectric conversion according to incident light is performed, and charges generated through this photoelectric conversion are held by the N-type semiconductor region 182. In a similar manner, the photoelectric conversion portion 102 has an N-type semiconductor region 183 and a P-type well region surrounding the N-type semiconductor region 183. On the basis of the charges generated through photoelectric conversion by the photoelectric conversion portions 101 and 102, image signals are generated by the pixel circuit, which is not illustrated.

The wiring layer 185 is a wiring line configured to transmit the image signals generated in the pixels 100 and the control signals for controlling the pixel circuits. The wiring layer 185 corresponds to the signal lines 91 and 92 described with reference to FIG. 1. Further, portions of the wiring layer 185 are insulated from each other by the insulating layer 184. Note that, the imaging element 9 including the pixel array portion 1 in FIG. 3 is a back-illuminated imaging element in which the wiring layer 185 is placed on a surface different from the light incident surface of the semiconductor substrate 181.

The on-chip lens 191 is a lens configured to concentrate incident light on the photoelectric conversion portions 101 and 102. Further, the on-chip lens 191 is placed on each of the pixels 100 so as to be shifted from the center of the pixel 100 according to the incident angle of light. The details of placement of the on-chip lens 191 are described later.

In the lower layer of the on-chip lens 191, the color filter 192 and the planarization film 193 are arranged. The color filter 192 is an optical filter, and is a filter configured to transmit light having a predetermined wavelength, for example, red light of, light that has penetrated the on-chip lens 191. The planarization film 193 is placed between the color filter 192 and the waveguide 110 and the like, which are described later, and is a film for making a surface on which the color filter 192 is to be formed flat. With the planarization film 193, the color filter 192 having a uniform thickness can be formed.

The waveguides 110 and 120 guide, to the photoelectric conversion portions 101 and 102, light incident through the on-chip lens 191. The waveguide 110 guides incident light to the photoelectric conversion portion 101, and the waveguide 120 guides incident light to the photoelectric conversion portion 102. The waveguides each include a core serving as an optical path and cladding accommodating the core. Specifically, the waveguide 110 includes a core 115 and claddings 111 and 112, and the waveguide 120 includes a core 125 and claddings 121 and 122. Note that, the cladding 111 and the like each correspond to the inner surface of the cladding in contact with the core. The cladding has the plurality of surfaces. Further, the cladding 111 and the like each correspond to the surface of an opening portion in a cladding member 199, the opening portion being extended from the surface of the cladding member 199 to the semiconductor substrate 181. With a core material 198 placed in the opening portion, the core 115 or the like is formed. The details of the configuration of the cladding are described later.

As the core material 198, a material having a higher refractive index than the cladding member 199 is employed, and light incident on the core 115 is totally reflected by the interface between the core 115 and the cladding 111 and the like. With this, light incident on the waveguide 110 or the like is guided from the entrance of the waveguide 110 or the like to the surface of the photoelectric conversion portion 101 or the like placed at the exit. As the core 115 and the like, insulators having light transparency, for example, silicon nitride (SiN), can be used. Further, as the cladding member 199, an insulator having a smaller refractive index than the core 115 and the like, for example, silicon oxide ($SiO_2$), can be used.

As described above, in the pixel 100a, the waveguides 110 and 120 are arranged. The waveguides 110 and 120 are formed into a shape having an exit narrower than an entrance. In other words, the inner surfaces of the cladding 111 and the like each have a shape with a predetermined inclination (tapered shape). Further, the waveguides 110 and 120 are formed into symmetrical shapes. In other words, the claddings 111 and 112 have symmetrical shapes to the claddings 121 and 122. Thus, losses in incident light guiding in the waveguides 110 and 120 are substantially the same. Further, the photoelectric conversion portions 101 and 102 are formed into substantially equivalent shapes.

The arrows in FIG. 3 represent light incident on the pixels 100a and 100b, and the light substantially vertically enters the pixel 100a placed in the center portion of the pixel array portion 1. The vertical incident light is divided by the waveguides 110 and 120 to be guided to the respective photoelectric conversion portions 101 and 102. Since the losses in the waveguides 110 and 120 are substantially the same as described above, the photoelectric conversion portions 101 and 102 have substantially the same sensitivity with respect to the incident light. tight incident on the pixel 100 through the center of the on-chip lens 191 is hereinafter referred to as "principal ray."

Meanwhile, in the pixel 100b, the waveguides 130 and 120 are arranged. The waveguide 130 includes a core 135 and claddings 131 and 132. Of those, the cladding 132 is formed into a shape substantially equivalent to that of the cladding 112. Meanwhile, the cladding 131 is formed at a smaller inclination angle than the cladding 111. Thus, the waveguide 130 has a smaller exit-to-entrance area ratio than the waveguides 110 and 120. A narrower exit increases a loss. Thus, in the pixel 100b, losses in the two waveguides 130 and 120 are different from each other, that is, the loss in the waveguide 130 placed closer to the center of the pixel array portion 1 is larger. As a result, in the pixel 100b, the sensitivity of the photoelectric conversion portion 101 is lower than the sensitivity of the photoelectric conversion portion 102.

As illustrated in FIG. 3, light enters the pixel 100b diagonally. In FIG. 3, it is assumed that light enters the pixel 100b at an incident angle of 15°. In other words, the incident light is shifted to the left by 15° from the vertical direction on the figure. In order to compensate for this, the pupil correction described above is performed, and the on-chip lens 191 is placed by being shifted toward the center of the pixel array portion 1 with the center of the pixel 100b serving as a reference. In other words, the centers of the on-chip lens 191 and the pixel 100b are located at different positions. Here, the on-chip lens 191 is placed at a position that allows principal rays to reach the boundary between the waveguides 130 and 120. In other words, in the pixel 100b, principal rays enter the top portion of the cladding member 199 placed at the boundary between the waveguides 130 and 120. With this, incident light having smaller incident angles than principal rays is guided to the photoelectric conversion portion 101, and incident light having larger incident angles than principal rays is guided to the photoelectric conversion portion 102. A cross point, which is described later, can be set as a principal ray incident angle, and image signals according to focus shifts can be obtained. Note that, the cladding member 199 placed at the boundary between the waveguides 130 and 120 has a cross-sectional shape that is a triangle shape having two sides inclined at substantially the same angle.

Here, light enters the waveguide 130 at a smaller incident angle than that in the waveguide 120. Specifically, light enters the waveguide 130 at an angle relatively close to the vertical direction. This achieves a high incident-light-and-waveguide coupling efficiency. Meanwhile, since the waveguide 120 is placed in the end portion of the on-chip lens 191, light enters the waveguide 120 at a relatively large angle. In such a case, the light is coupled to a high-order light-guiding mode of the waveguide, resulting in low incident-light-and-waveguide coupling efficiency.

Accordingly, as described above, a difference in coupling efficiency between the waveguides 130 and 120 is compensated for through adjustment of the losses in the waveguides 130 and 120 with the waveguides 130 and 120 having the different cladding shapes. In other words, the waveguide 130 having the high coupling efficiency includes the cladding 131 formed at the smaller inclination angle than that in the waveguide 120 to increase the loss. With this, the quantity of light that reaches the photoelectric conversion portion 101 from the on-chip lens 191 through the waveguide 130 can be substantially the same as the quantity of light that reaches the photoelectric conversion portion 102 through the waveguide 120. In this way, with the waveguides 130 and 120 having the dissimilar cladding shapes according to the shift of the on-chip lens 191, the quantities of light that passes through the waveguides 130 and 120 can be adjusted. In the pixel 100b, the photoelectric conversion portions 101 and 102 can have the same sensitivity.

As described above, the imaging element 9 in FIG. 3 has a back-illuminated configuration. Since the wiring layer 185 and the insulating layer 184 are formed on a surface different from the surface on which the waveguide 110 and the like are formed of the semiconductor substrate 181, the waveguide 110 and the like can be easily arranged, and the shapes of the cladding 131 and the like of each of the pixels 100 can be easily adjusted on the basis of incident angles. With the waveguide 130 and the like having the different cladding inner surface shapes, the sensitivity of the pixel A and that of the pixel B in the phase difference pixel can be adjusted. Further, the N-type semiconductor regions 182 and 183 of the photoelectric conversion portions 101 and 102 in the semiconductor substrate 181 can have the same shape in all the pixels 100 of the pixel array portion 1, with the result that formation of the diffusion layer of the semiconductor substrate 181 can be simplified.

Note that, the imaging element 9 can be a front-illuminated imaging element. Specifically, in the imaging element 9 in FIG. 3, the cladding member 199 is used as the insulating layer 184 and the wiring layer 185 is embedded in the region of the cladding member 199 of the waveguide 110 and the like. A front-illuminated imaging element can be formed in this way. In this case, the wiring layer 185 is required to be placed in consideration that the waveguide 130 and the like are to have different cladding inner surface shapes. As described in a second embodiment described later, when the cladding members 199, each of which is placed at the boundary between two waveguides in the pixel 100, are formed into shapes greatly different from each other, a measure such that the wiring layer 185 is not placed at positions corresponding to the cladding members 199 placed at the boundaries or other measure is required.

[Configuration of Waveguide]

Figure 4:
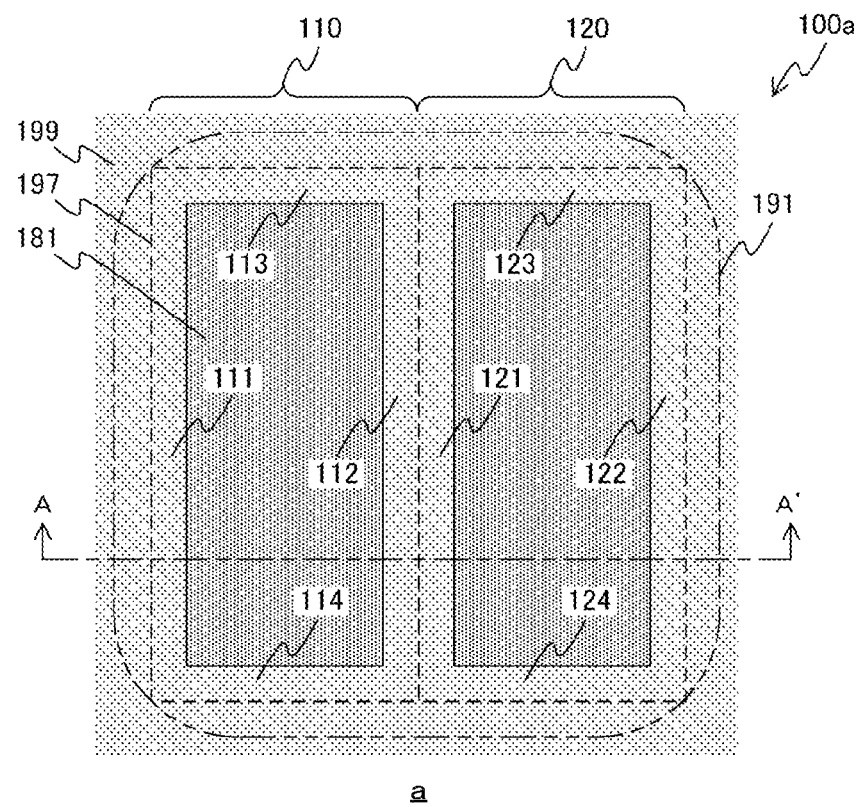
FIG. 4 is a view illustrating configuration examples of waveguides according to the first embodiment of the present technology.
Figure 4:
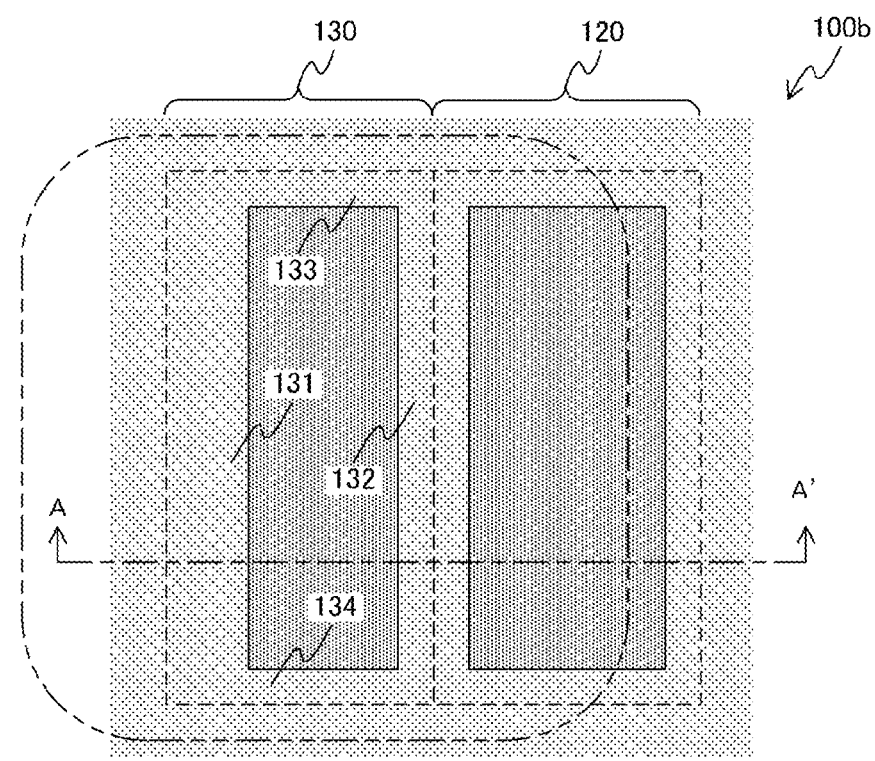

FIG. 4 is a view illustrating configuration examples of the waveguides according to the first embodiment of the present technology. FIG. 4 is a top view illustrating the configurations of the waveguides in the pixels 100, and is a top view illustrating the shape of the cladding member 199. In FIG. 4, a illustrates the waveguide configuration of the pixel 100a, and b illustrates the waveguide configuration of the pixel 100b. In FIG. 4, the dotted line represents a ridge line 197 of the cladding member 199. The rectangles formed by the ridge line 197 represent the entrances of the waveguide 110 and the like. Further, the long dashed double-short dashed line represents the on-chip lens 191. Note that, the cross-sectional configurations along the line A-A' in a and b of FIG. 4 correspond to the configurations of the pixels 100a and 100b in FIG. 3

The pixel 100a illustrated in a of FIG. 4 includes the waveguides 110 and 120. The waveguide 110 includes cladding having four rectangular (trapezoid) inner surfaces with a predetermined inclination. In other words, the waveguide 110 includes claddings 111 to 114. At the exit of the waveguide 110, namely, in the bottom portions of the claddings 111 to 114, the semiconductor substrate 131 is placed. The claddings 111 to 114 are inclined at substantially the same angle. In a similar manner, the waveguide 120 includes claddings 121 to 124. The claddings 111 to 114 are inclined at substantially the same angle.

The pixel 100b illustrated in b of FIG. 4 includes the waveguide 130 instead of the waveguide 110 of the pixel 100a. The waveguide 130 includes claddings 131 to 134. The claddings 132, 133, and 134 are inclined at the same angles as the claddings 112, 113, and 114 in a of FIG. 4, respectively. Meanwhile, the cladding 131 is inclined at a smaller inclination angle than the claddings 132 to 134. Thus, the exit of the waveguide 130 is narrower than those of the waveguides 110 and 120. As described above, the waveguide 130 has a smaller exit-to-entrance area ratio.

[Characteristic of Photoelectric Conversion Portion]

Figure 5:
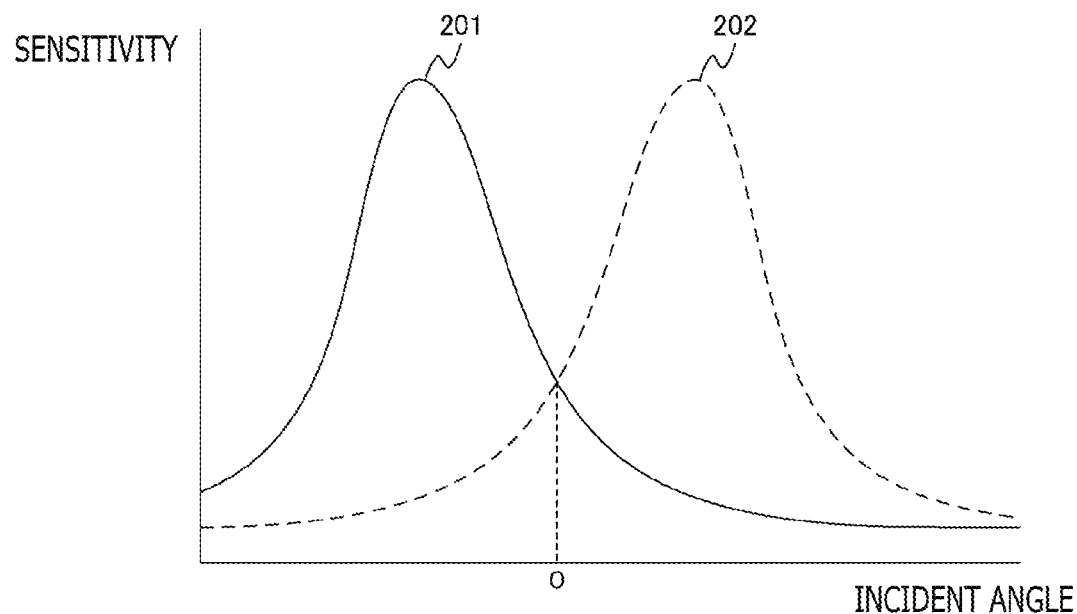
FIG. 5 is a diagram illustrating examples of the characteristics of photoelectric conversion portions in the pixel according to the first embodiment of the present technology.
Figure 5:
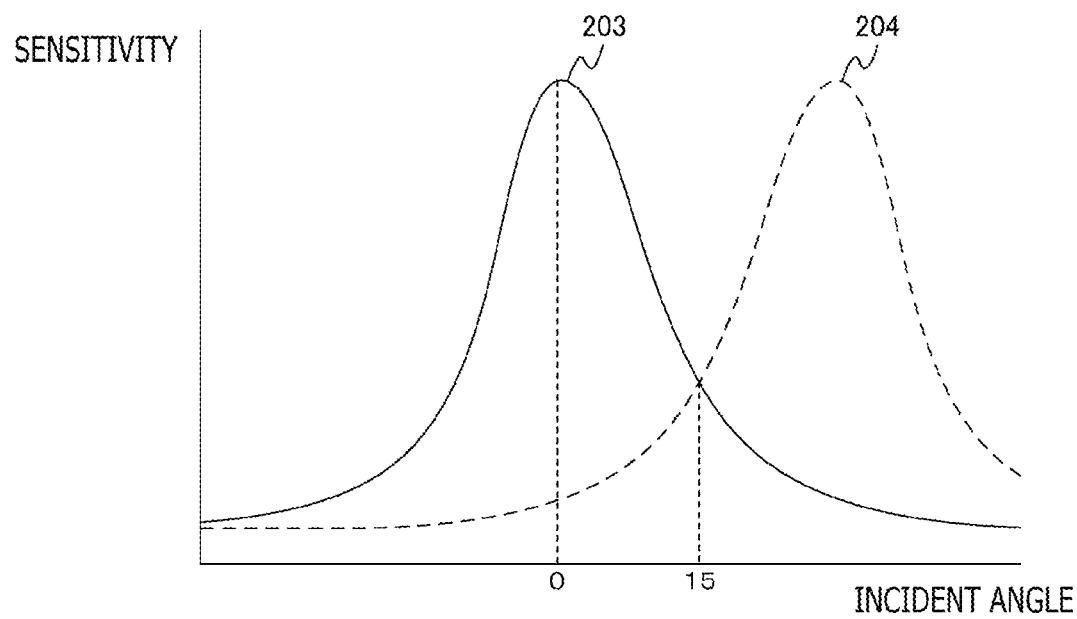

FIG. 5 is a diagram illustrating examples of the characteristics of the photoelectric conversion portions in the pixel according to the first embodiment of the present technology. FIG. 5 is a diagram illustrating the incident-angle and sensitivity relationships of the two photoelectric conversion portions arranged in the pixel 100. In FIG. 5, the horizontal axis indicates the incident angle (unit: degree) of light incident on the pixel 100, and the vertical axis indicates the sensitivity. Here, "sensitivity" is the ratio of an image signal to the quantity of incident light. In FIG. 5, a illustrates the incident-angle and sensitivity relationships in the pixel 100a, and b illustrates the incident-angle and sensitivity relationships in the pixel 100b.

The graphs 201 and 202 in a of FIG. 5 indicate the incident-angle and sensitivity relationships of the photoelectric conversion portions 101 and 102 in the pixel 100a. In other words, the graph 201 indicates the sensitivity of the pixel A at the position of the pixel 100a and the graph 202 indicates the sensitivity of the pixel B at the position of the pixel 100a. In the pixel 100a, the waveguides 110 and 120 are formed symmetrically. Thus, the graphs 201 and 202 cross each other with an incident angle of zero, and the graphs 201 and 202 have symmetrical shapes. In the pixel 100a, since principal rays enter vertically (0°), an incident angle shift when the focus position of the photographing lens is what is generally called a front focus or a rear focus can be detected from a phase difference between the image signals of the pixel A and the pixel B. Note that, the point at which the graphs 201 and 202 cross each other is referred to as "cross point."

In b of FIG. 5, the graphs 203 and 204 indicate the incident-angle and sensitivity relationships of the photoelectric conversion portions 101 and 102 in the pixel 100b. In the pixel 100b in b of FIG. 5, the principal ray incident angle is 15°. Thus, pupil correction is performed so that the graphs 203 and 204 cross each other with the incident angle of 15°. In other words, the on-chip lens 191 is placed by being shifted from the center of the pixel 100b as described with reference to FIG. 3. Here, of the waveguides 130 and 120, the cladding shape of the waveguide 130, which is placed in the shift direction of the on-chip lens 191, is adjusted so that the photoelectric conversion portions 101 and 102 have the same incident-angle and sensitivity relationship. With this, the incident-angle and sensitivity relationships of the photoelectric conversion portions 101 and 102 in the pixel 100b can be adjusted as indicated by the graphs 203 and 204 illustrated in b of FIG. 5. In other words, the cross point is formed at the principal ray incident angle of 15° so that the incident-angle and sensitivity relationships can have symmetrical shapes. With this, also in the pixel 100b placed in the peripheral portion of the pixel array portion 1, the focus position of the photographing lens can be detected from a difference between the image signals of the pixel A and the pixel B.

Note that, photographing lenses having standard exit pupil distances (EPDs) are assumed for the principal ray incident angle (15° in FIG. 5) in the pixel 100b placed in the peripheral portion of the pixel array portion 1. In other words, in the imaging element 9, pupil correction suitable for the photographing lenses having standard EPDs is employed.

[Waveguide Manufacturing Method]

Figure 6:
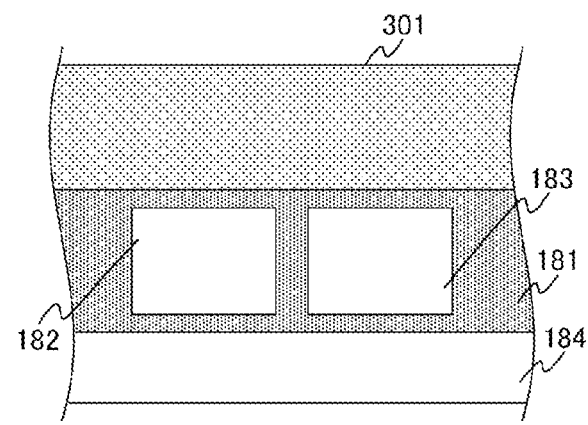
FIG. 6 is a view illustrating an example of an imaging element manufacturing method with respect to the pixel according to the first embodiment of the present technology.
Figure 6:
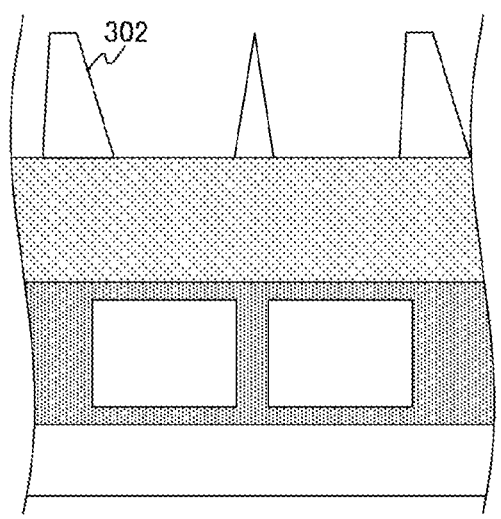
Figure 6:
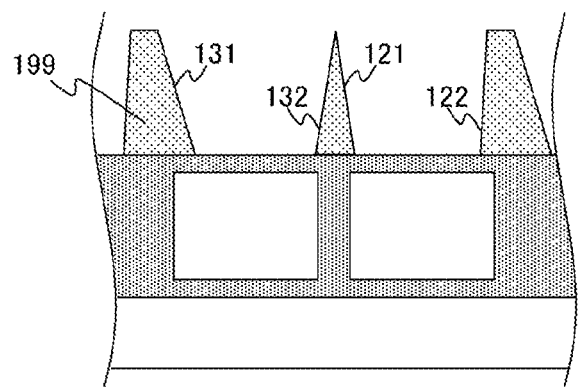
Figure 7:
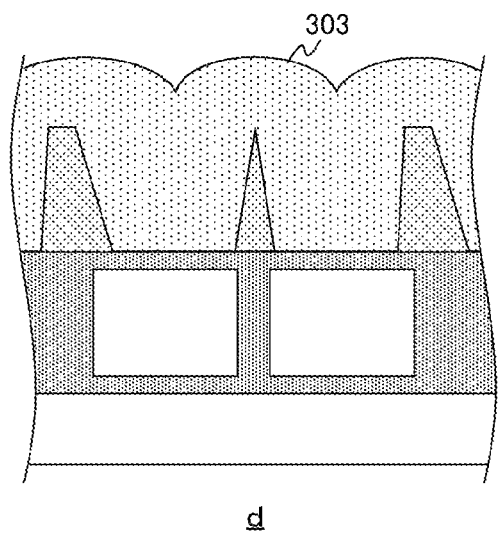
FIG. 7 is a view illustrating the example of the imaging element manufacturing method with respect to the pixel according to the first embodiment of the present technology.
Figure 7:
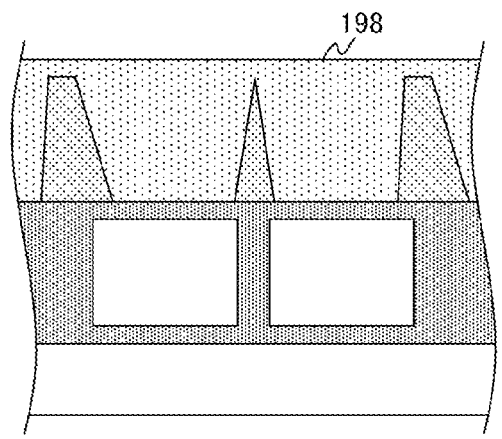

FIG. 6 and FIG. 7 are views illustrating an example of an imaging element manufacturing method with respect to the pixel according to the first embodiment of the present technology. FIG. 6 and FIG. 7 are views illustrating a waveguide manufacturing process in the manufacturing process of the imaging element 9. The manufacturing process is described by taking the waveguides 130 and 120 in the pixel 100b of the pixel array portion 1 as examples.

First, on the rear surface of the semiconductor substrate 181 having formed thereon the insulating layer 184 and the like, a film of a cladding material 301 is formed. This can be formed by, for example, CVD (Chemical Vapor Deposition) (a of FIG. 6). Next, a resist 302 is formed on the cladding material 301 (b of FIG. 6). The resist 302 is formed into the same shape as the cladding member 199 described with reference to FIG. 3. In other words, in the waveguide 130, the resist 302 having a shape with the same inclination as the claddings 131 and 132 is formed. Such an inclination can be formed as follows, for example: a photosensitive resist is applied, and the photosensitive resist is formed by being exposed with the use of a grayscale mask and being developed. Here, "grayscale mask" is a mask having gradation of shade formed thereon, and is a mask in which the shade of the gradation is gradually and continuously changed according to an inclination. The exposure amount can be changed according this shade of the gradation. Thus, the developed resist has a thickness according to the shade of the gradation. The resist 302 having a predetermined inclination can be formed in this way.

Note that, due to the pupil correction, the cladding shapes (inclinations) of the waveguides in the pixels 100 are different from each other according to positions from the center of the pixel array portion 1. Thus, exposure can sequentially be performed with the use of the grayscale mask in which the shade of the gradation is gradually changed from the pixels 100 in the center portion of the pixel array portion 1 toward the peripheral portion. With this, a resist having different inclinations between pixel positions in the pixel array portion 1 can be formed.

Next, dry etching is performed with the resist 302 being a mask. As dry etching, anisotropic etching is used. With this, the cladding material 301 is etched, and the cladding member 199 including the cladding 131 and the like can thus be formed (c of FIG. 6). Next, the film of a core material 303 is formed. This can be formed by, for example, CVD (d of FIG. 7). Next, the surface of the core material 303 is made flat by polishing. The surface can be made flat by, for example, dry etching or chemical mechanical polishing (CMP). With this, the core material 198 can be formed, and the waveguide 130 and the like can thus be formed (e of FIG. 7). After that, the planarization film 193, the color filter 192, and the on-chip lenses 191 are sequentially formed. The imaging element 9 can be manufactured in this way.

As described above, in the imaging element 9 according to the first embodiment of the present technology, with the plurality of waveguides having the cladding shapes dissimilar to each other, the sensitivity of each of the plurality of photoelectric conversion portions in the phase difference pixel is adjusted. Here, the sensitivity of the photoelectric conversion portions can be adjusted without being affected by the shifted position of the on-chip lens 191, which is due to pupil correction, with the result that waveguide formation can be simplified.

2. Second Embodiment

The imaging element 9 of the first embodiment described above uses the phase difference pixels assuming the photographing lenses having standard EPDs. In contrast, the imaging element 9 according to a second embodiment of the present technology is different from the first embodiment in including a plurality of phase difference pixels supporting photographing lenses having different EPDs.

[Cross-Sectional Configuration of Pixel]

Figure 8:
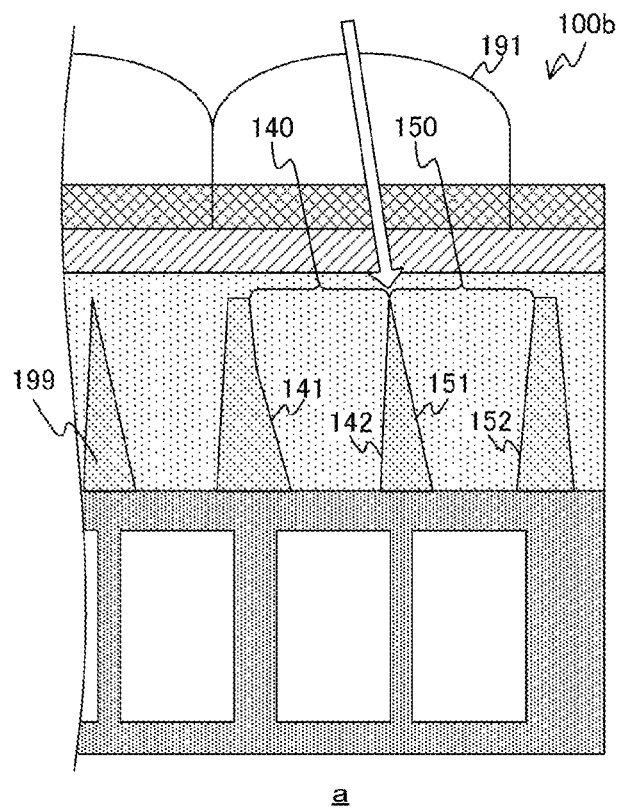
FIG. 8 is a view illustrating configuration examples of a pixel according to a second embodiment of the present technology.
Figure 8:
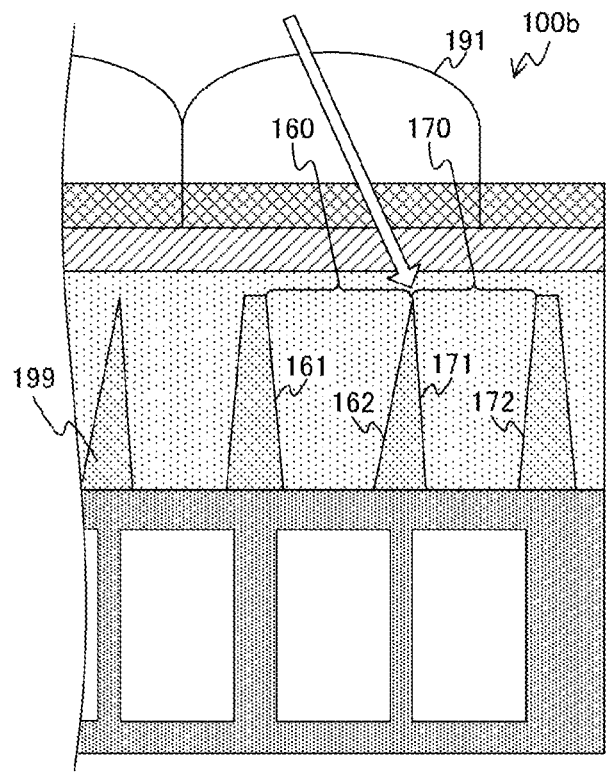

FIG. 8 is a view illustrating configuration examples of a pixel according to the second embodiment of the present technology. FIG. 8 is a view illustrating examples of a phase difference pixel supporting principal rays having incident angles different from that in the phase difference pixels (assuming the incident angle of 15° described with reference to FIG. 3. In FIG. 8, a illustrates a configuration example of the pixel 100b assuming an incident angle of 10°, and b illustrates a configuration example of the pixel 100b assuming an incident angle of 20°. The pixels 100b are arranged in the pixel array portion 1 separately from the pixel 100b described with reference to FIG. 3, and are used as phase difference pixels when photographing lenses having EPDs different from the standard EPDs are used. Note that, in FIG. 8, the illustrations of the insulating layer 184 and the wiring layer 185 are omitted.

The pixel 100b in a of FIG. 8 includes waveguides 140 and 150 instead of the waveguides 130 and 120 of the pixel 100b described with reference to FIG. 3. The on-chip lens 191 in a of FIG. 8 is placed by being shifted from the center of the pixel 100b toward the center portion of the pixel array portion 1. Specifically, the on-chip lens 191 is placed at a position that allows a principal ray having an incident angle of 10° to enter the top portion of the cladding member 199 placed at the boundary between the waveguides 140 and 150 so that pupil correction is performed. The waveguide 140 includes claddings 141 and 142, and the waveguide 150 includes claddings 151 and 152.

The cladding member 199 placed at the boundary between the waveguides 140 and 150 has a cross-sectional shape that is a triangle shape with a vertex inclined in the shift direction of the on-chip lens 191. In other words, the cladding 151 forming a side on a side different from the shift direction of the on-chip lens 191 is formed at a smaller inclination angle than the cladding 142 forming a side on the same side as the shift direction of the on-chip lens 191. Meanwhile, the cladding 141 of the waveguide 140 has two inclinations with different inclination angles. Since the inclination of the cladding is changed in the middle of the waveguide, a loss in the waveguide 140 is larger than that in a waveguide including cladding having a single inclination. In this way, in the waveguide 140, the cladding 142 is formed at the inclination angle close to the vertical direction, and the cladding 141 has an inclination angle that is changed step-by-step, and is formed at a relatively small inclination angle in the vicinity of the exit of the waveguide 140. With this, the loss in the waveguide 140 with respect to the waveguide 150 is adjusted.

The pixel 100b in b of FIG. 8 includes waveguides 160 and 170 instead of the waveguides 130 and 120. Similarly to a of FIG. 8, the on-chip lens 191 in b of FIG. 8 is placed at a position that allows a principal ray having an incident angle of 20° to enter the top portion of the cladding member 199 placed at the boundary between the waveguides 160 and 170. The waveguide 160 includes claddings 161 and 162, and the waveguide 170 includes claddings 171 and 172.

The cladding member 199 placed at the boundary between the waveguides 160 and 170 has a cross-sectional shape that is a triangle shape with a vertex inclined in a direction different from the shift direction of the on-chip lens 191. The incident angle of a principal ray in b of FIG. 8 is 20°, and is an incident angle larger than that in the pixel 100b in a of FIG. 8. Thus, the cladding member 199 placed at the boundary between the waveguides 160 and 170 is formed into the cross-sectional shape that is the triangle shape with the vertex inclined in the direction different from the shift direction of the on-chip lens 191. With this, while principal rays enter the boundary between the waveguides 160 and 170, the area of the exit of the waveguide 170 is made substantially equivalent to that of the exit of the waveguide 150 in a of FIG. 8.

Further, since the cladding 162 is formed at a relatively small inclination angle, with the cladding 161 formed at a large inclination angle, a loss in the waveguide 160 with respect to the waveguide 170 can be adjusted.

In this way, the cladding members 199, each of which is placed at the boundary between two waveguides arranged in the pixel 100b, have different shapes depending on the EPD of a corresponding photographing lens to support pupil correction, and the claddings of the respective waveguides have different inclinations, on the side different from the waveguide boundary. With this, waveguide losses can be adjusted.

Note that, the configuration of the imaging element 9 according to the second embodiment of the present technology is not limited to this example. For example, the cladding 141 in a of FIG. 8 can have a single inclination.

The remaining configuration of the imaging element 9 is similar to the configuration of the imaging element 9 according to the first embodiment of the present technology, and hence description thereof is omitted.

As described above, in the imaging element 9 according to the second embodiment of the present technology, the phase difference pixels supporting the incident angles of a plurality of principal rays are arranged in the pixel array portion 1. With this, in the case where photographing lenses having different EPDs are used, focus positions can be detected by the phase difference pixels.

3. Third Embodiment

The imaging element 9 of the first embodiment described above uses, as the cladding member 199 placed at the boundary between the two waveguides arranged in the pixel 100, the cladding member 199 having the triangle shape with the vertex in section. On the other hand, the imaging element 9 according to a third embodiment of the present technology uses the cladding member 199 having different vertex shapes.

[Cross-Sectional Configuration of Pixel]

Figure 9:
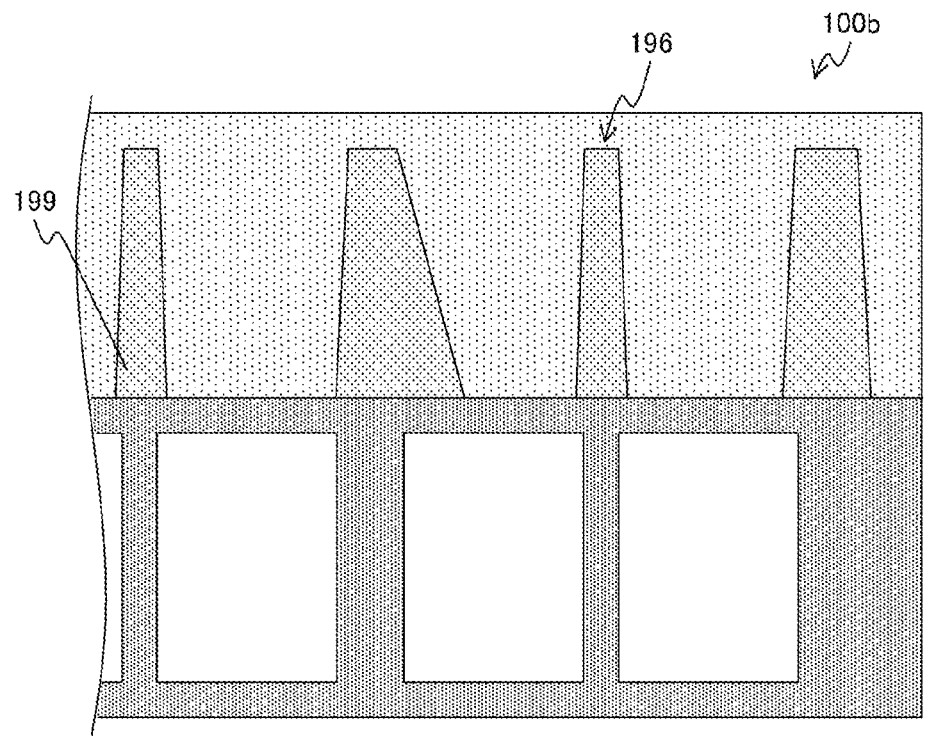
FIG. 9 is a view illustrating configuration examples of a pixel according to a third embodiment of the present technology.
Figure 9:
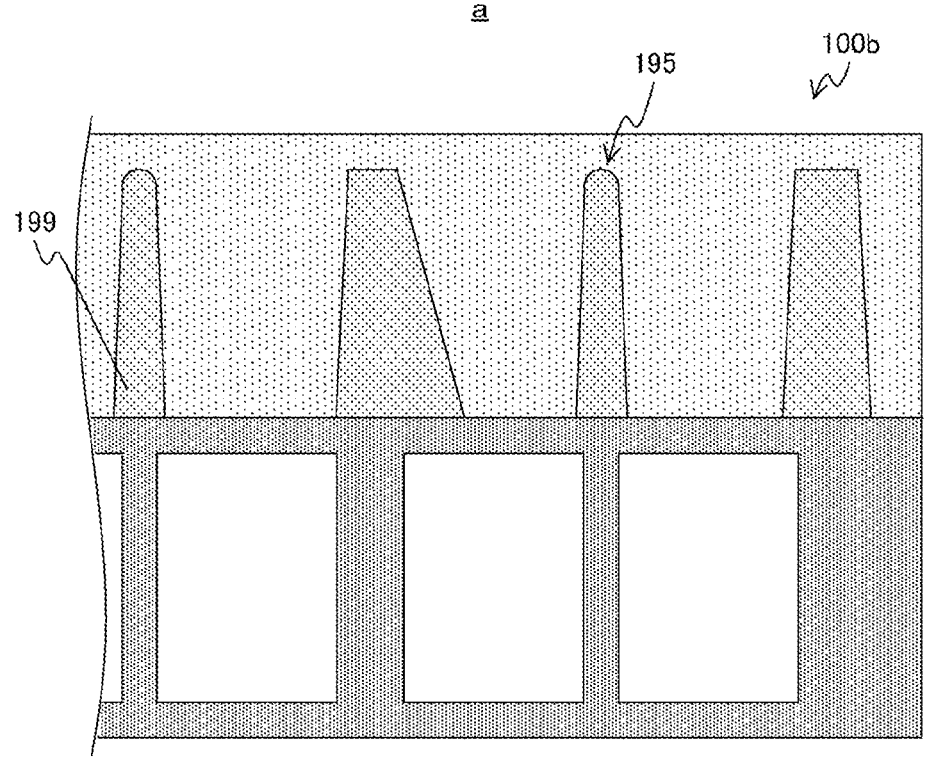

FIG. 9 is a view illustrating configuration examples of the pixel according to the third embodiment of the present technology. The pixel 100b in FIG. 9 is different from the pixel 100b described with reference to FIG. 3 in the shape of the top portion of the cladding member 199 placed at the boundary between two waveguides. Note that, in the pixel 100b in FIG. 9, the illustrations of the on-chip lens 191, the color filter 192, the planarization film 193, the insulating layer 184, and the wiring layer 185 are omitted.

In a of FIG. 9, as the cladding member 199 placed at the boundary between two waveguides, the cladding member 199 having a flat top portion 196 is used. Further, in b of FIG. 9, as the cladding member 199 placed at the boundary between two waveguides, the cladding member 199 having a top portion 195 having an arc shape in section is used. Either shape makes it possible to easily form the cladding member 199 compared to the cladding member 199 having an acute top portion. Note that, when pupil correction is performed, the on-chip lens 191 is placed by being shifted to a position that allows principal rays to enter the top portion of the cladding member 199.

The remaining configuration of the imaging element 9 is similar to the configuration of the imaging element 9 according to the first embodiment of the present technology, and hence description thereof is omitted.

As described above, the imaging element 9 according to the third embodiment of the present technology uses the cladding member 199 having the flat top portion or the top portion having the arc shape in section, and hence waveguide formation can further be simplified.

4. Modified Examples

The imaging element 9 of the first embodiment described above includes the two waveguides arranged adjacent to each other in the lateral direction of the pixel array portion 1. On the other hand, in modified examples of the embodiment of the present technology, the waveguide arrangement is changed.

[Cross-Sectional Configuration of Pixel]

Figure 10:
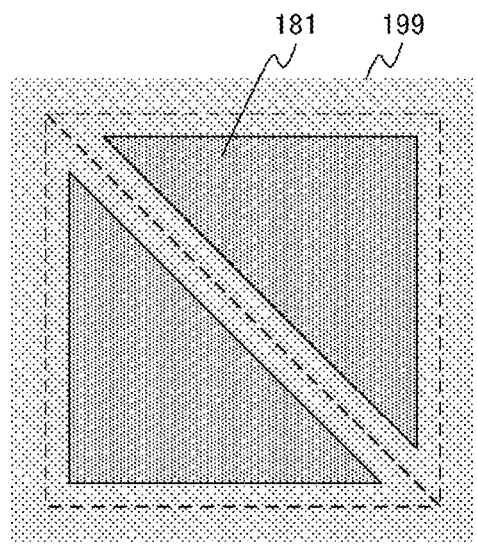
FIG. 10 is a view illustrating configuration examples of waveguides according to modified examples of the embodiment of the present technology.
Figure 10:
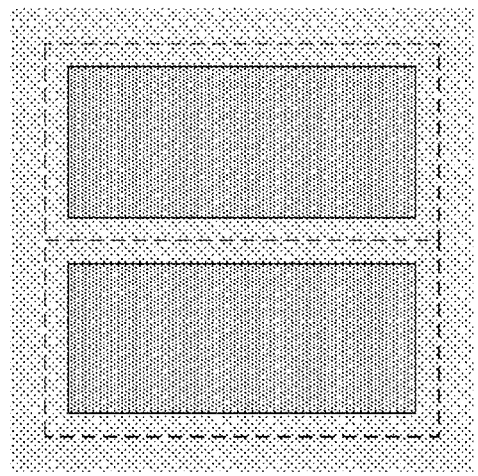
Figure 10:
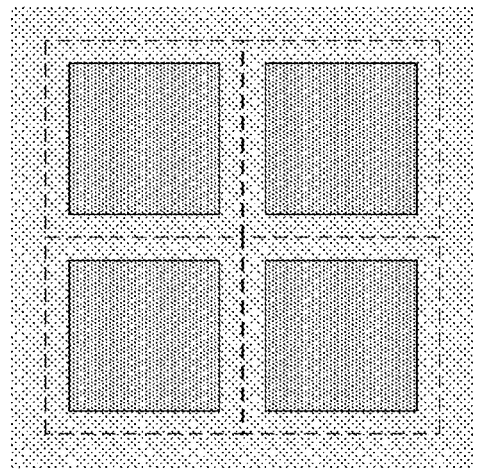
Figure 10:
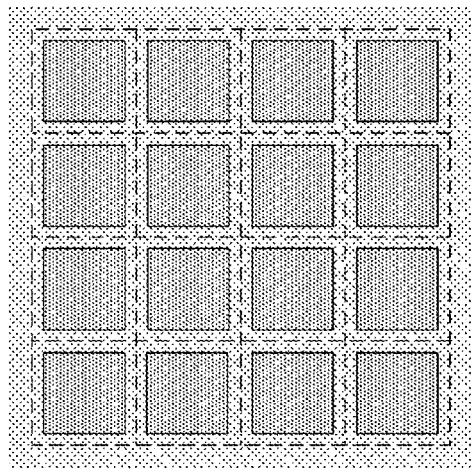

FIG. 10 is a view illustrating configuration examples of waveguides according to the modified examples of the embodiment of the present technology. FIG. 10 is a view illustrating the configuration examples of the waveguides in arrangements different from those of the waveguides described with reference to FIG. 4. In FIG. 10, a illustrates an example of the pixel 100 in which two waveguides formed into a triangle shape are arranged adjacent to each other in the diagonal direction. In this case, the bottom sides of the two waveguides are adjacent to each other. Further, b of FIG. 10 illustrates an example of the pixel 100 in which two waveguides formed into a rectangular shape are arranged adjacent to each other in the longitudinal direction. In this case, the long sides of the two waveguides are adjacent to each other. Note that, photoelectric conversion portions in such pixels 100 are formed into substantially the same shapes as the waveguides and are each placed at a position corresponding to the exit of the waveguide.

Each of a plurality of the pixels 100 including the waveguides in a of FIG. 10 is arranged in the pixel array portion 1 in the diagonal direction and used for focus position detection. Meanwhile, each of the plurality of pixels 100 including the waveguides in b of FIG. 10 is arranged in the pixel array portion 1 in the longitudinal direction and used for focus position detection.

As described above, for focus position detection, phase difference of images based on image signals from the pixels A and the pixels B of a plurality of phase difference pixels is required to be detected. Here, depending on objects, it is sometimes difficult to detect an image phase difference by the pixels A and the pixels B in the phase difference pixels arranged in the lateral direction, such as the pixels 100a and 100b described with reference to FIG. 2. For example, in a case where an object has little change in brightness in the lateral direction, images from the pixel A and the pixel B are images substantially equivalent to each other, and a phase difference thus becomes difficult to detect. Accordingly, phase difference is detected with the phase difference pixels arranged also in the diagonal direction or the longitudinal direction in the pixel array portion 1. With this, object phase difference can be detected from a plurality of directions, and the detection accuracy of focus positions can be enhanced.

Further, c of FIG. 10 illustrates an example of the pixel 100 including four waveguides, and d of FIG. 10 illustrates an example of the pixel 100 including 16 waveguides. Note that, irrespective of the number of waveguides, two photoelectric conversion portions are arranged in each of the pixels 100. In such pixels, waveguide losses can be adjusted by individually changing the shapes of the waveguides. For example, in the example in c of FIG. 10, the waveguides in which the inclination angles of the cladding are different from each other according to the arrangement positions in the pixel array portion 1 can be arranged. In other words, in a pixel placed in the center portion of the pixel array portion 1, the cladding inclination of the waveguide is not changed, while in a pixel placed in the peripheral portion, the cladding inclinations of all the waveguides are changed. Further, in the pixel 100 placed between the center portion and the peripheral portion of the pixel array portion 1, of the two waveguides, which are provided for each photoelectric conversion portion, the cladding inclination of one waveguide is changed. in this way, waveguide losses can be adjusted according to the positions of the pixels 100 in the pixel array portion 1.

Note that, the configuration of the imaging element 9 according to the modified examples of the embodiment of the present technology is not limited to the examples. For example, phase difference pixels each including four or more photoelectric conversion portions can be arranged. Specifically, in c of FIG. 10, the phase difference pixels each can include a photoelectric conversion portion provided for every four waveguides.

The remaining configuration of the imaging element 9 is similar to the configuration of the imaging element 9 according to the first embodiment of the present technology, and hence description thereof is omitted.

5. Application Example for Camera

The present technology can be applied to various products. For example, the present technology may be realized as an imaging element that is mounted on an imaging device such as a camera.

Figure 11:
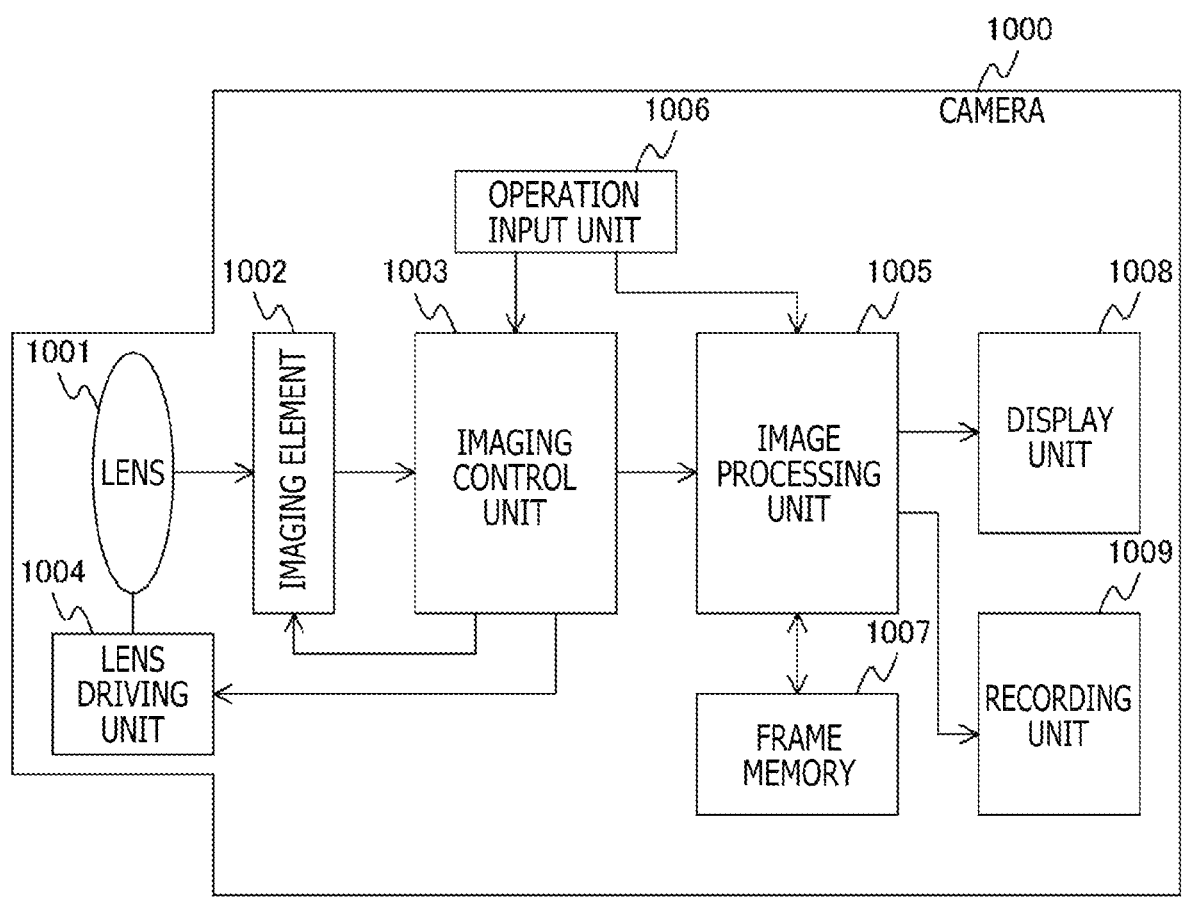
FIG. 11 is a block diagram illustrating a schematic configuration example of a camera that is an example of an imaging device to which the present technology can be applied.

FIG. 11 is a block diagram illustrating a schematic configuration example of a camera that is an example of an imaging device to which the present technology can be applied. A camera 1000 in FIG. 11 includes a lens 1001, an imaging element 1002, an imaging control unit 1003, a lens driving unit 1004, an image processing unit 1005, an operation input unit 1006, a frame memory 1007, a display unit 1008, and a recording unit 1009.

The lens 1001 is a photographing lens of the camera 1000. The lens 1001 collects light from an object and makes the light enter the imaging element 1002 described later to form an image of the object.

The imaging element 1002 is a semiconductor element configured to image light from an object collected by the lens 1001. The imaging element 1002 generates analog image signals corresponding to radiated light, converts the analog image signals into digital image signals, and outputs the digital image signals.

The imaging control unit 1003 controls imaging in the imaging element 1002. The imaging control unit 1003 controls the imaging element 1002 by generating control signals and outputting the control signals to the imaging element 1002. Further, the imaging control unit 1003 can perform autofocus in the camera 1000 on the basis of image signals output from the imaging element 1002. Here, "autofocus" is a system that detects the focus position of the lens 1001 and automatically adjusts the focus position. As this autofocus, a method in which an image plane phase difference is detected by phase difference pixels arranged in the imaging element 1002 to detect a focus position (image plane phase difference autofocus) can be used. Further, a method in which a position at which the contrast of an image is highest is detected as a focus position (contrast autofocus) can also be applied. The imaging control unit 1003 adjusts the position of the lens 1001 through the lens driving unit 1004 on the basis of the detected focus position, to thereby perform autofocus. Note that, the imaging control unit 1003 can include, for example, a DSP (Digital Signal Processor) equipped with firmware.

The lens driving unit 1004 drives the lens 1001 on the basis of control of the imaging control unit 1003. The lens driving unit 1004 can drive the lens 1001 by changing the position of the lens 1001 using a built-in motor.

The image processing unit 1005 processes image signals generated by the imaging element 1002. This processing includes, for example, demosaicing that generates image signals of lacking color among image signals corresponding to red, green, and blue for each pixel, noise reduction that removes noise of image signals, and encoding of image signals. Note that, the image processing unit 1005 can include, for example, a microcomputer equipped with firmware.

The operation input unit 1006 receives operation inputs from a user of the camera 1000. As the operation input unit 1006, for example, a push button or a touch panel can be used. An operation input received by the operation input unit 1006 is transmitted to the imaging control unit 1003 and the image processing unit 1005. After that, processing corresponding to the operation input, for example, the processing of imaging an object or the like, is started.

The frame memory 1007 is a memory configured to store frames that are image signals for one screen. The frame memory 1007 is controlled by the image processing unit 1005 and holds frames in the course of image processing.

The display unit 1008 displays images processed by the image processing unit 1005. For example, a liquid crystal panel can be used as the display unit 1008.

The recording unit 1009 records images processed by the image processing unit 1005. As the recording unit 1009, for example, a memory card or a hard disk can be used.

The camera to which the present invention can be applied has been described above. The present technology can be applied to the imaging element 1002 among the configurations described above. Specifically, the imaging element 9 described with reference to FIG. 1 can be applied to the imaging element 1002. The imaging control unit 1003 detects image plane phase difference on the basis of the image signals generated by the phase difference pixels arranged in the imaging element 9, and controls the lens driving unit 1004 to adjust the position of the lens 1001, thereby being capable of executing autofocus. With this, focus positions can be detected on the basis of image signals generated by the phase difference pixels in which pupil correction has been performed, enabling the camera 1000 to obtain sharp images. Note that, the imaging control unit 1003 is an example of a processing circuit described in the scope of claims. The camera 1000 is an example of an imaging device described in the scope of claims.

Note that, although the camera has been described as an example here, the technology according to the present invention may be applied to other devices such as monitoring devices, for example.

Finally, the description of each embodiment above is an example of the present technology, and the present technology is not limited to the above-mentioned embodiments. For this reason, it is a matter of course that various modifications, other than the above-mentioned embodiments, can be made according to the design and the like as long as they do not depart from the technical idea according to the present technology.

Further, the process procedures described in the above-mentioned embodiments may be regarded as a method including the series of procedures. Alternatively, the process procedures may be regarded as a program for causing a computer to execute the series of procedures or a recording medium storing the program. As this recording medium, for example, a CD (Compact Disc), a DVD (Digital Versatile Disk), a memory card, or the like can be used.

Note that, the present technology can also take the following configurations.

(1) An imaging element, including:
an on-chip lens that is configured to concentrate incident light on a pixel and placed on each of pixels so as to be shifted from a center of the pixel according to an incident angle of the incident light;
a plurality of photoelectric conversion portions arranged in the pixel and configured to perform photoelectric conversion according to the incident light; and
a plurality of waveguides arranged for the plurality of respective photoelectric conversion portions in the pixel, the plurality of waveguides each being configured to guide the incident light concentrated so that the incident light enters each of the plurality of photoelectric conversion portion, and being formed into shapes dissimilar to each other on the basis of the shift of the on-chip lens.

(2) The imaging element according to (1), in which
the plurality of waveguides each include a core serving as an optical path and cladding accommodating the core, and are different from each other in inner surface inclination of the cladding from an entrance to an exit of the incident light in each of the waveguides and thus have dissimilar shapes.

(3) The imaging element according to (2), in which
the plurality of waveguides are different from each other in inner surface inclination of the cladding according to the shift of the on-chip lens.
(4) The imaging element according to (2), in which
the plurality of waveguides each include the cladding having a plurality of inner surfaces formed of different inclinations.
(5) The imaging element according to any one of (1) to (4), further including:
a pixel circuit that is placed in the pixel and configured to generate an image signal based on photoelectric conversion in the plurality of photoelectric conversion portions; and
a wiring layer that is placed on a surface different from a surface for receiving the concentrated incident light, of surfaces of a semiconductor substrate on which the photoelectric conversion portions are formed, the wiring layer being configured to transmit the image signal.
(6) The imaging element according to any one of (1) to (5), in which
the pixel includes two photoelectric conversion portions and two waveguides.
(7) The imaging element according to any one of (1) to (6), in which
the pixels are arranged two-dimensionally in a grid pattern, and
the on-chip lens is placed by being shifted from the center of the pixel according to the incident angle of the incident light on each of the pixels arranged.
(8) The imaging element according to any one of (1) to (7), further including:
a plurality of the on-chip lenses each of which is placed by being shifted from the center of the pixel according to the incident angle with respect to each lens configured to make light from an object enter an imaging element corresponding to the lens; and
a plurality of the pixels each of which includes the plurality of waveguides formed into shapes dissimilar to each other on the basis of the shift of each of the plurality of on-chip lenses.
(9) An imaging device, including:
an on-chip lens that is configured to concentrate incident light on a pixel and placed on each of pixels so as to be shifted from a center of the pixel according to an incident angle of the incident light;
a plurality of photoelectric conversion portions arranged in the pixel and configured to perform photoelectric conversion according to the incident light;
a plurality of waveguides arranged for the plurality of respective photoelectric conversion portions in the pixel, the plurality of waveguides each being configured to guide the incident light concentrated so that the incident light enters each of the plurality of photoelectric conversion portion, and being formed into shapes dissimilar to each other on the basis of the shift of the on-chip lens;
a pixel circuit that is placed in the pixel and configured to generate an image signal based on photoelectric conversion in the plurality of photoelectric conversion portions; and
a processing circuit configured to detect a phase difference on the basis of a plurality of image signals based on photoelectric conversion by the plurality of photoelectric conversion portions.

REFERENCE SIGNS LIST

1 Pixel array portion
2 Vertical driving portion
3 Column signal processing portion
4 Control portion
9 Imaging element
100, 100a, 100b Pixel
101, 102 Photoelectric conversion portion
110, 120, 130, 140, 150, 160, 170 Waveguide
111 to 114, 121 to 124, 131 to 134, 141, 142, 151, 152, 161, 162, 171, 172 Cladding
115, 125, 135 Core
181 Semiconductor substrate
184 Insulating layer
185 Wiring layer
191 On-chip lens
198 Core material
199 Cladding member
1000 Camera
1001 Lens
1002 Imaging element
1003 Imaging control unit
1004 Lens driving unit

What is claimed is:

1. An imaging element, comprising:
a plurality of pixels formed in a pixel array,
wherein a first set of the plurality of pixels is formed in a center portion of the pixel array and a second set of the plurality of pixels is formed on a periphery portion of the pixel array;
an on-chip lens that is configured to concentrate incident light on the plurality of pixels,
wherein the on-chip lens is placed above and centered with respect to each of the first set of the plurality of pixels and placed above and off centered with respect to each of the second set of the plurality of pixels;
a plurality of photoelectric conversion portions arranged in each of the plurality of pixels and configured to perform photoelectric conversion according to the incident light; and
a plurality of waveguides arranged for each of the plurality of respective photoelectric conversion portions in each of the plurality of pixels,
wherein the plurality of waveguides are each configured to guide the incident light concentrated so that the incident light enters each of the plurality of photoelectric conversion portions,
wherein each of a first waveguide and a second waveguide of the plurality of waveguides for the first set of the plurality of pixels and a second waveguide of the plurality of waveguides for the second set of the plurality of pixels is the same and a first waveguide of the plurality of waveguides for the second set of the plurality of pixels is different than each of the first waveguide and the second waveguide for the first set of the plurality of pixels and the second waveguide for the second set of the plurality of pixels, and
wherein the second waveguide for the second set of the plurality of pixels is located closer to the periphery portion of the pixel array than the first waveguide for the second set of the plurality of pixels.

2. The imaging element according to claim 1, wherein the plurality of waveguides each include a core serving as an optical path and cladding accommodating the core, and are different from each other in inner surface inclination of the cladding from an entrance to an exit of the incident light in each of the waveguides and thus have dissimilar shapes.

3. The imaging element according to claim 2, wherein the plurality of waveguides are different from each other in inner surface inclination of the cladding according to the shift of the on-chip lens.

4. The imaging element according to claim 2, wherein the plurality of waveguides each include the cladding having a plurality of inner surfaces formed of different inclinations.

5. The imaging element according to claim 1, further comprising:
  a pixel circuit that is placed in each of the plurality of pixels and configured to generate an image signal based on photoelectric conversion in the plurality of photoelectric conversion portions; and
  a wiring layer that is placed on a surface different from a surface for receiving the concentrated incident light, of surfaces of a semiconductor substrate in which the photoelectric conversion portions are formed, the wiring layer being configured to transmit the image signal.

6. The imaging element according to claim 1, wherein each of the plurality of pixels includes two photoelectric conversion portions and two waveguides.

7. The imaging element according to claim 1, wherein
  the plurality of pixels are arranged two-dimensionally in a grid pattern, and
  the on-chip lens is placed by being shifted from the center of the second set of the plurality of pixels according to the incident angle of the incident light on each of the plurality of pixels arranged.

8. The imaging element according to claim 1, further comprising:
  a plurality of the on-chip lenses each of which is placed by being shifted from the center of the second set of the plurality of pixels according to the incident angle with respect to each lens configured to make light from an object enter an imaging element corresponding to the lens.

9. An imaging device, comprising:
  a plurality of pixels formed in a pixel array,
  wherein a first set of the plurality of pixels is formed in a center portion of the pixel array and a second set of the plurality of pixels is formed on a periphery portion of the pixel array;
  an on-chip lens that is configured to concentrate incident light on the plurality of pixels,
  wherein the on-chip lens is placed above and centered with respect to each of the first set of the plurality of pixels and placed above and off centered with respect to each of the second set of the plurality of pixels;
  a plurality of photoelectric conversion portions arranged in each of the plurality of pixels and configured to perform photoelectric conversion according to the incident light;
  a plurality of waveguides arranged for each of the plurality of respective photoelectric conversion portions in each of the plurality of pixels,
  wherein the plurality of waveguides are each configured to guide the incident light concentrated so that the incident light enters each of the plurality of photoelectric conversion portions,
  wherein each of a first waveguide and a second waveguide of the plurality of waveguides for the first set of the plurality of pixels and a second waveguide of the plurality of waveguides for the second set of the plurality of pixels is the same and a first waveguide of the plurality of waveguides for the second set of the plurality of pixels is different than each of the first waveguide and the second waveguide for the first set of the plurality of pixels and the second waveguide for the second set of the plurality of pixels, and
  wherein the second waveguide for the second set of the plurality of pixels is located closer to the periphery portion of the pixel array than the first waveguide for the second set of the plurality of pixels;
  a pixel circuit that is placed in each of the plurality of pixels and configured to generate an image signal based on photoelectric conversion in the plurality of photoelectric conversion portions; and
  a processing circuit configured to detect a phase difference on a basis of a plurality of image signals based on photoelectric conversion by the plurality of photoelectric conversion portions.

10. The imaging device according to claim 9, wherein the plurality of waveguides each include a core serving as an optical path and cladding accommodating the core, and are different from each other in inner surface inclination of the cladding from an entrance to an exit of the incident light in each of the waveguides and thus have dissimilar shapes.

11. The imaging device according to claim 10, wherein the plurality of waveguides are different from each other in inner surface inclination of the cladding according to the shift of the on-chip lens.

12. The imaging device according to claim 10, wherein the plurality of waveguides each include the cladding having a plurality of inner surfaces formed of different inclinations.

13. The imaging device according to claim 9, further comprising:
  a wiring layer that is placed on a surface different from a surface for receiving the concentrated incident light, of surfaces of a semiconductor substrate in which the photoelectric conversion portions are formed, the wiring layer being configured to transmit the image signal.

14. The imaging device according to claim 9, wherein each of the plurality of pixels includes two photoelectric conversion portions and two waveguides.

15. The imaging device according to claim 9, wherein
  the plurality of pixels are arranged two-dimensionally in a grid pattern, and the on-chip lens is placed by being shifted from the center of the second set of the plurality of pixels according to the incident angle of the incident light on each of the plurality of pixels arranged.

16. The imaging device according to claim 9, further comprising:
  a plurality of the on-chip lenses each of which is placed by being shifted from the center of the second set of the plurality of pixels according to the incident angle with respect to each lens configured to make light from an object enter an imaging element corresponding to the lens.

* * * * *